United States Patent
Byl et al.

(10) Patent No.: US 9,269,582 B2
(45) Date of Patent: Feb. 23, 2016

(54) CLUSTER ION IMPLANTATION OF ARSENIC AND PHOSPHORUS

(75) Inventors: Oleg Byl, Southbury, CT (US);
Chongying Xu, New Milford, CT (US);
William Hunks, Waterbury, CT (US);
Richard S. Ray, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 207 days.

(21) Appl. No.: 14/006,662

(22) PCT Filed: Mar. 22, 2012

(86) PCT No.: PCT/US2012/030214
§ 371 (c)(1),
(2), (4) Date: Sep. 21, 2013

(87) PCT Pub. No.: WO2012/129454
PCT Pub. Date: Sep. 27, 2012

(65) Prior Publication Data
US 2014/0011346 A1    Jan. 9, 2014

Related U.S. Application Data

(60) Provisional application No. 61/467,232, filed on Mar. 24, 2011.

(51) Int. Cl.
*H01L 21/265* (2006.01)
*H01J 37/317* (2006.01)
(52) U.S. Cl.
CPC .......... *H01L 21/265* (2013.01); *H01J 37/3171* (2013.01); *H01L 21/26566* (2013.01); *H01J 2237/08* (2013.01); *H01L 21/26513* (2013.01)

(58) Field of Classification Search
CPC .................................................. H01L 21/26513
See application file for complete search history.

(56) References Cited

U.S. PATENT DOCUMENTS

| 7,994,031 B2 | 8/2011 | Horsky et al. |
| 2007/0105325 A1* | 5/2007 | Horsky et al. ............. 438/301 |
| 2008/0122005 A1* | 5/2008 | Horsky et al. ............. 257/369 |
| 2008/0138967 A1 | 6/2008 | Li et al. |
| 2009/0004806 A1 | 1/2009 | Spirak |
| 2009/0047768 A1* | 2/2009 | Jain ........................ 438/306 |
| 2009/0111236 A1* | 4/2009 | Kakehata et al. ......... 438/406 |
| 2010/0200954 A1 | 8/2010 | Del Agua Borniquel et al. |
| 2011/0027957 A1 | 2/2011 | Berry |
| 2011/0092058 A1* | 4/2011 | Del Agua Borniquel et al. ................... 438/530 |
| 2011/0108742 A1* | 5/2011 | Weaver et al. ......... 250/492.21 |
| 2012/0045615 A1* | 2/2012 | Kirkpatrick et al. ......... 428/141 |
| 2012/0119201 A1* | 5/2012 | Ueno et al. ................. 257/40 |

* cited by examiner

*Primary Examiner* — Joseph C Nicely
(74) *Attorney, Agent, or Firm* — Hultquist, PLLC; Steven J. Hultquist; Rosa Yaghmour

(57) ABSTRACT

An ion implantation method, in which a dopant source composition is ionized to form dopant ions, and the dopant ions are implanted in a substrate. The dopant source composition includes cluster phosphorus or cluster arsenic compounds, for achieving P- and/or As-doping, in the production of doped articles of manufacture, e.g., silicon wafers or precursor structures for manufacturing microelectronic devices.

15 Claims, No Drawings

US 9,269,582 B2

CLUSTER ION IMPLANTATION OF ARSENIC AND PHOSPHORUS

CROSS-REFERENCE TO RELATED APPLICATIONS

This application is a U.S. national phase under the provisions of 35 U.S.C. §371 of International Patent Application No. PCT/US12/30214 filed Mar. 22, 2012, which in turn claims the benefit of priority of U.S. Provisional Patent Application No. 61/467,232 filed Mar. 24, 2011. The disclosures of such international patent application and U.S. provisional patent application are hereby incorporated herein by reference in their respective entireties, for all purposes.

FIELD

The present invention relates to ion implantation methods, and more specifically to cluster ion implantation of arsenic and phosphorus utilizing dopant compositions effective therefor.

RELATED ART

In the field of ion implantation, e.g., in the manufacture of semiconductor devices, there is continuing interest in improving the efficiency of the implant process. Arsenic and phosphorus are commonly used dopant species.

In conventional practice, a source compound for the dopant species is provided in gaseous form. The source compound, if not in the gas phase, may be volatilized by sublimation or vaporization techniques from solid form or liquid form source compounds. The resulting dopant gas then is subjected to ionization to form ionic species that are separated by electrode arrays to form an ion beam containing ions of the desired type. Ions in the ion beam are accelerated through a beamline structure and impinged on a substrate to effect implantation of the ions in the substrate.

Concerning the source compounds utilized for such ion implantation, such compounds must meet specific criteria. First, such compounds must be in gaseous form or volatilizable to gaseous form, and the resulting gas-phase compound must have appropriate transport properties, so that it can be conducted through the lines to the ion source of the ion implanter without premature degradation, condensation, or other adverse occurrence that would render the gas phase source compound unsuitable for ion implantation usage. Second, such compounds must be ionizable to form suitable ionic species for implantation. Since ions are selected for implantation on the basis of their mass to charge ratio, the source compound must be ionizable to form desired ionic species that are able to be separated by extraction and focusing electrodes to form a beam of the desired ionic species that is not contaminated with undesired ions. Third, such compounds must be ionizable at appropriate process conditions, including suitable voltage conditions, under the processing regime obtaining in the ion source vacuum chamber. Fourth, such compounds must provide sufficient amount of the desired ionic species for implantation.

In many cases, the dopant source compound is monoatomic in the atom that is ionized to constitute the ionic species for implantation. From the perspective of the volume of dopant source compound that must be provided, stored and processed, it is far preferable to utilize dopant source compounds that are polyatomic in the atom that is ionized to constitute the ionized species for implantation. By using polyatomic dopant source compounds, the amount of dopant ions obtainable per unit volume of the dopant source compound can be substantially increased over monoatomic dopant source compounds, with increasing numbers of dopant atoms in the source compound generally being increasingly preferred.

Thus, higher order dopant source compounds (higher number of dopant atoms per molecule of the source compound) are typically preferred over lower order dopant source compounds (lower number of dopant atoms per molecule of the source compound). In this relational context, dopant source compounds having significantly higher numbers of dopant atoms in relation to other conventional source compounds are termed "cluster" compounds, the term "cluster" referring to the fact that higher numbers of dopant atoms, e.g., two, three, four, five, six, seven, eight, nine, ten or more dopant atoms are present in the specific compound of interest.

Consistent with the foregoing discussion, there is significant interest in dopant source compounds for ionic species such as phosphorus or arsenic in which the source compound contains more than one atom of the dopant species, e.g., phosphorus source compounds containing more than two phosphorus atoms, and arsenic source compounds containing more than two arsenic atoms.

SUMMARY

The present disclosure relates to ion implantation, and more specifically to ion implantation of arsenic and phosphorus, using dopant source compounds that contain multiple atoms of arsenic or phosphorus.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range. In other words, a carbon number range is deemed to affirmatively set forth each of the carbon number species in the range, as to the substituent, moiety, or compound to which such range applies, as a selection group from which specific ones of the members of the selection group may be selected, either as a sequential carbon number sub-range, or as specific carbon number species within such selection group.

The same construction and selection flexibility is applicable to stoichiometric coefficients and numerical values specifying the number of atoms, functional groups, ions or moieties, as to specified ranges, numerical value constraints (e.g., inequalities, greater than, less than constraints), as well as oxidation states and other variables determinative of the specific form, charge state, and composition applicable to dopant sources, implantation species, and chemical entities within the broad scope of the present disclosure.

In one aspect, the disclosure relates to an ion implantation method, comprising ionizing a dopant source composition to form dopant ions, and implanting the dopant ions in a substrate, wherein the dopant source composition comprises a composition selected from the group consisting of:

(i) phosphorus hydrides of the formula $P_nH_x$ wherein n is an integer having a value of from 2 to 22, and x is an integer having a value of from 2 to 11;
(ii) arsenic hydrides of the formula $As_nH_y$, wherein n is an integer having a value of from 2 to 5, and y is an integer having a value of from 2 to 10;
(iii) phosphorus and diphosphorus halides and oxyhalides;
(iv) arsenic and diarsenic halides and oxyhalides;
(v) substituted phosphanes of the formula $P_nH_xR_y$, wherein R is selected from alkyl, alkoxy, O, NR and other functional groups containing H, C, O and N atoms, n is an integer having a value of from 2 to 22, x is an integer having a value of from 2 to 22, and y is an integer having a value of from 1 to 22;
(vi) substituted arsines of the formula $As_nH_xR_y$, wherein R is selected from alkyl, O, NR and other functional groups containing H, C, O and N atoms, n is an integer having a value of from 2 to 22, x is an integer having a value of from 2 to 22, and y is an integer having a value of from 1 to 22;
(vii) diphosphanes of the formula $R_2P-PR'_2$ wherein $R_2$ and $R'_2$ are each independently selected from $C_{1-6}$ alkyls, aryls, and other functional groups containing H, C, O and N atoms;
(viii) diarsanes of the formula $R_2As-AsR'_2$ wherein $R_2$ and $R'_2$ are each independently selected from $C_{1-6}$ alkyls, aryls, and other functional groups containing H, C, O and N atoms;
(ix) phosphorus source compounds in combination with reducing agents that can induce in situ formation of product compounds with P—P bonds;
(x) arsenic source compounds in combination with reducing agents that can induce in situ formation of product compounds with As—As bonds;
(xi) phosphorus source compounds with P—P bonds, produced as reaction products of phosphorus halides and phosphorus hydrides;
(xii) arsenic source compounds with As—As bonds, produces reaction products of arsenic halides and arsenic hydrides;
(xiii) poly-phosphorus 6- and 7-member ring compounds, cluster halides and caged compounds; and
(xiv) poly-arsenic 6- and 7-member ring compounds, cluster halides and caged compounds.

The disclosure in another aspect relates to dopant source compositions including any one or more of the foregoing composition species.

Other aspects, features and embodiments of the disclosure will be more fully apparent from the ensuing description and appended claims.

DETAILED DESCRIPTION

The present disclosure relates to ion implantation, and more specifically to arsenic and phosphorus dopant source compositions. In various aspects, the disclosure relates to ion implantation of arsenic ions, in which the ions are derived from an arsenic dopant source composition containing multiple arsenic atoms. In other aspects, the disclosure relates to ion implantation of phosphorus ions, in which the ions are derived from a phosphorus dopant source composition containing multiple phosphorus atoms.

As used herein, the term "poly-phosphorus" in reference to compounds of the present disclosure means compounds containing two or more phosphorus atoms. The term "poly-arsenic" in reference to compounds of the present disclosure means compounds containing two or more arsenic atoms.

Specific dopant source compositions of the present disclosure include the following compositions:

(i) phosphorus hydrides of the formula $P_nH_y$, wherein n is an integer having a value of from 2 to 22, and x is an integer having a value of from 2 to 11, e.g., $P_2P_4$;
(ii) arsenic hydrides of the formula $As_nH_y$, wherein n is an integer having a value of from 2 to 5, and y is an integer having a value of from 2 to 10, e.g., $As_2F_4$;
(iii) phosphorus and diphosphorus halides (including mixed halides, e.g., $P_2Cl_2F_2$) and oxyhalides, e.g., $P_2I_4$, $POCl_3$, $PF_3$, and $P_2F_4$;
(iv) arsenic and diarsenic halides (including mixed halides, e.g., $As_2Cl_2F_2$) and oxyhalides, e.g., $As_2I_4$, $AsOCl_3$, $AsF_3$, and $As_2F_4$;
(v) substituted phosphanes of the formula $P_nH_xR_y$, wherein R is selected from alkyl, alkoxy, O, NR and other functional groups containing H, C, O and N atoms, e.g., $CH_3$, $OCH_3$, $N(CH_3)_2$, etc., n is an integer having a value of from 2 to 22, x is an integer having a value of from 2 to 22, preferably from 1 to 11, and y is an integer having a value of from 1 to 22, from 2 to 22-x, or from 1 to 11;
(vi) substituted arsines of the formula $As_nH_xR_y$, wherein R is selected from alkyl, O, NR and other functional groups containing H, C, O and N atoms, e.g., $CH_3$, $OCH_3$, $N(CH_3)_2$, etc., n is an integer having a value of from 2 to 22, x is an integer having a value of from 2 to 22, preferably from 1 to 11, and y is an integer having a value of from 1 to 22, from 2 to 22-x, or from 1 to 11;
(vii) diphosphanes of the formula $R_2P-PR'_2$ wherein $R_2$ and $R'_2$ are each independently selected from $C_{1-6}$ alkyls, aryls, and other functional groups containing H, C, O and N atoms, e.g., $CH_3$, $OCH_3$, $N(CH_3)_2$, etc.;
(viii) diarsanes of the formula $R_2As-AsR'_2$ wherein $R_2$ and $R'_2$ are each independently selected from $C_{1-6}$ alkyls, aryls, and other functional groups containing H, C, O and N atoms, e.g., $CH_3$, $OCH_3$, $N(CH_3)_2$, etc.;
(ix) phosphorus source compounds in combination with reducing agents that can induce in situ formation of product compounds with P—P bonds;
(x) arsenic source compounds in combination with reducing agents that can induce in situ formation of product compounds with As—As bonds;
(xi) phosphorus source compounds with P—P bonds, produced as reaction products of phosphorus halides and phosphorus hydrides;
(xii) arsenic source compounds with As—As bonds, produces reaction products of arsenic halides and arsenic hydrides;
(xiii) poly-phosphorus 6- and 7-member ring compounds, cluster halides and caged compounds; and
(xiv) poly-arsenic 6- and 7-member ring compounds, cluster halides and caged compounds.

It will be recognized that the foregoing dopant source compounds may be utilized in various combinations of two or more thereof, to provide multiple arsenic and/or phosphorus compositions producing ions for implantation. The present disclosure also contemplates the provision of isotopically enriched forms of arsenic and phosphorus compounds, whereby the arsenic and phosphorus ions resulting from ionization of such compounds have a specific predetermined isotopic composition.

The dopant source compounds of the present disclosure are usefully provided in gas phase form, being first volatilized or vaporized when the dopant source compound is of solid or liquid form, and delivered to the ion source chamber of an ion implanter, for ionization therein. The ionized dopant source then may be processed using extraction and focusing electrodes to produce an ion beam that is accelerated, e.g., through an acceleration column or beam line structure, and impinged on a substrate for implantation of ions in the bulk volume thereof. The substrate may be a silicon wafer or other substrate useful for manufacturing a microelectronic device.

Other methods of ion implantation can also be employed utilizing the dopant source compounds of the present disclosure, other than beamline ion implantation processes. Thus, the dopant source compounds of the present disclosure can also be utilized in plasma immersion ion implantation, sputtering ionization ion implantation, plasma source ion implantation, thermal evaporation ion implantation, electron beam evaporation ion implantation, and cathodic arc ion implantation processes. While the disclosure herein is primarily directed to beamline ion implantation processes, it will be appreciated that the disclosure is not thus limited, but rather extends to and includes any other techniques now known or hereafter discovered that may be utilized to effect ion implantation utilizing dopant source compositions.

The dopant source gaseous compositions subjected to ionization to generate ions for implantation are sometimes hereinafter referred to as dopant feedstock gases. The dopant feedstock gases may be provided and process conditions may be employed to take advantage of the capability of phosphorus and arsenic to form tetramers in the gas phase, and the tendency of phosphorus and arsenic compounds at elevated temperatures to form dimers and monomers, depending on the specific temperature and pressure levels.

The ion implantation process of the present disclosure in various embodiments comprises ionizing vaporized dopant species in a vacuum chamber under ionization conditions to generate ions, and accelerating the ions by electric field to implant ions into a device substrate. The device substrate may be a silicon wafer, or other semiconductor manufacturing substrate, or alternatively may comprise a substrate for manufacturing flat panel displays, or a substrate for manufacturing solar panel articles.

The dopant source compositions of the present disclosure can be provided in the first instance in packaged form. If the dopant source composition is of gaseous form at standard conditions (25° C., one bar pressure), the dopant source composition may be supplied in a conventional high-pressure gas cylinder, or in absorbed form on a suitable physical sorbent medium contained in a gas storage and dispensing vessel, such as a vessel of the type commercially available from ATMI, Inc. (Danbury, Conn., USA) under the trademark SDS. If the dopant source composition is of liquid form, it may be provided in package form, as contained in a liquid storage and gas dispensing vessel of a type commercially available from ATMI, Inc. (Danbury, Conn., USA) under the trademark VAC, wherein the vessel is equipped with an internally disposed gas pressure regulator. If the dopant source composition is a solid form composition, it may be provided in a vaporizer vessel that is heated to volatilize, e.g., sublimate, the solid source material to form the dopant feedstock gas. Solid source vessels of such type are actually available from ATMI, Inc. (Danbury, Conn., USA) under the trademark ProE-Vap.

The dopant source supply vessel may be provided in the gas box of the ion implanter, or may be located outside of the gas box in the implanter enclosure, or outside of the implanter enclosure, and may be arranged to supply dopant feedstock gas to the ion source in any suitable manner.

In embodiments in which the reducing agent is co-flowed with the dopant source compound to form corresponding reaction product compounds containing P—P or As—As bonds, the reducing agent may be introduced to the dopant source compound in a flowline, mixing chamber, or other mixing locus appropriate to effect the mixing of the reducing agent and the dopant source compound for reaction to form the reaction product compound.

The dopant feedstock gas can be flowed to the ion chamber in a carrier gas stream, using a carrier gas such as argon, xenon, helium, or other carrier gas medium.

The disclosure therefore contemplates an ion implantation method, comprising ionizing a dopant source composition to form dopant ions, and implanting the dopant ions in a substrate, wherein the dopant source composition comprises a composition selected from the group consisting of:

(i) phosphorus hydrides of the formula $P_nH_x$ wherein n is an integer having a value of from 2 to 22, and x is an integer having a value of from 2 to 11, e.g., $P_2F_4$;

(ii) arsenic hydrides of the formula $As_nH_y$ wherein n is an integer having a value of from 2 to 5, and y is an integer having a value of from 2 to 10, e.g., $As_2F_4$;

(iii) phosphorus and diphosphorus halides (including mixed halides, e.g., $P_2Cl_2F_2$) and oxyhalides, e.g., $P_2I_4$, $POCl_3$, $PF_3$, and $P_2F_4$;

(iv) arsenic and diarsenic halides (including mixed halides, e.g., $As_2Cl_2F_2$) and oxyhalides, e.g., $As_2I_4$, $AsOCl_3$, $AsF_3$, and $As_2F_4$;

(v) substituted phosphanes of the formula $P_nH_xR_y$, wherein R is selected from alkyl, alkoxy, O, NR and other functional groups containing H, C, O and N atoms, e.g., $CH_3$, $OCH_3$, $N(CH_3)_2$, etc., n is an integer having a value of from 2 to 22, x is an integer having a value of from 2 to 22, preferably from 1 to 11, and y is an integer having a value of from 1 to 22, from 2 to 22-x, or from 1 to 11;

(vi) substituted arsines of the formula $As_nH_xR_y$, wherein R is selected from alkyl, O, NR and other functional groups containing H, C, O and N atoms, e.g., $CH_3$, $OCH_3$, $N(CH_3)_2$, etc., n is an integer having a value of from 2 to 22, x is an integer having a value of from 2 to 22, preferably from 1 to 11, and y is an integer having a value of from 1 to 22, from 2 to 22-x, or from 1 to 11;

(vii) diphosphanes of the formula $R_2P$—$PR'_2$ wherein $R_2$ and $R'_2$ are each independently selected from $C_{1-6}$ alkyls, aryls, and other functional groups containing H, C, O and N atoms, e.g., $CH_3$, $OCH_3$, $N(CH_3)_2$, etc.;

(viii) diarsanes of the formula $R_2As$—$AsR'_2$ wherein $R_2$ and $R'_2$ are each independently selected from $C_{1-6}$ alkyls, aryls, and other functional groups containing H, C, O and N atoms, e.g., $CH_3$, $OCH_3$, $N(CH_3)_2$, etc.;

(ix) phosphorus source compounds in combination with reducing agents that can induce in situ formation of product compounds with P—P bonds;

(x) arsenic source compounds in combination with reducing agents that can induce in situ formation of product compounds with As—As bonds;

(xi) phosphorus source compounds with P—P bonds, produced as reaction products of phosphorus halides and phosphorus hydrides;

(xii) arsenic source compounds with As—As bonds, produced as reaction products of arsenic halides and arsenic hydrides;
(xiii) poly-phosphorus 6- and 7-member ring compounds, cluster halides and caged compounds; and
(xiv) poly-arsenic 6- and 7-member ring compounds, cluster halides and caged compounds.

In one embodiment of such ion implantation method, the dopant source composition comprises a composition selected from the group consisting of phosphorus hydrides of the formula $P_nH_x$ wherein n is an integer having a value of from 2 to 22, and x is an integer having a value of from 2 to 11, e.g., $P_2F_4$;

In another embodiment, the dopant source composition comprises a composition selected from the group consisting of arsenic hydrides of the formula $As_nH_y$, wherein n is an integer having a value of from 2 to 5, and y is an integer having a value of from 2 to 10, e.g., $As_2F_4$.

In a further embodiment, the dopant source composition comprises a composition selected from the group consisting of phosphorus and diphosphorus halides (including mixed halides, e.g., $P_2Cl_2F_2$) and oxyhalides, e.g., $P_2I_4$, $POCl_3$, $PF_3$, and $P_2F_4$.

The dopant source composition in another embodiment comprises a composition selected from the group consisting of arsenic and diarsenic halides (including mixed halides, e.g., $As_2Cl_2F_2$) and oxyhalides, e.g., $As_2I_4$, $AsOCl_3$, $AsF_3$, and $As_2F_4$.

The method in another embodiment employs a dopant source composition comprising a composition selected from the group consisting of substituted phosphanes of the formula $P_nH_xR_y$, wherein R is selected from alkyl, alkoxy, O, NR and other functional groups containing H, C, O and N atoms, e.g., $CH_3$, $OCH_3$, $N(CH_3)_2$, etc., n is an integer having a value of from 2 to 22, x is an integer having a value of from 2 to 22, preferably from 1 to 11, and y is an integer having a value of from 1 to 22, from 2 to 22-x, or from 1 to 11.

A further embodiment of the method includes the use of a dopant source composition comprising a composition selected from the group consisting of substituted arsines of the formula $As_nH_xR_y$, wherein R is selected from alkyl, O, NR and other functional groups containing H, C, O and N atoms, e.g., $CH_3$, $OCH_3$, $N(CH_3)_2$, etc., n is an integer having a value of from 2 to 22, x is an integer having a value of from 2 to 22, preferably from 1 to 11, and y is an integer having a value of from 1 to 22, from 2 to 22-x, or from 1 to 11.

The ion implantation method in another embodiment utilizes a dopant source composition comprising a composition selected from the group consisting of diphosphanes of the formula $R_2P—PR'_2$ wherein $R_2$ and $R'_2$ are each independently selected from $C_{1-6}$ alkyls, aryls, and other functional groups containing H, C, O and N atoms, e.g., $CH_3$, $OCH_3$, $N(CH_3)_2$, etc.

The method in another embodiment employs a dopant source composition comprising a composition selected from the group consisting of diarsanes of the formula $R_2As—AsR'_2$ wherein $R_2$ and $R'_2$ are each independently selected from $C_{1-6}$ alkyls, aryls, and other functional groups containing H, C, O and N atoms, e.g., $CH_3$, $OCH_3$, $N(CH_3)_2$, etc.

In a further embodiment, the dopant source composition comprises a composition selected from the group consisting of phosphorus source compounds in combination with reducing agents that can induce in situ formation of product compounds with P—P bonds.

The dopant source composition in another embodiment comprises use of a dopant source composition comprising a composition selected from the group consisting of arsenic source compounds in combination with reducing agents that can induce in situ formation of product compounds with As—As bonds.

In a further embodiment, the dopant source composition comprises a composition selected from the group consisting of phosphorus source compounds with P—P bonds, produced as reaction products of phosphorus halides and phosphorus hydrides.

Another embodiment of the method of the disclosure comprises use of a dopant source composition comprising a composition selected from the group consisting of arsenic source compounds with As—As bonds, produced as reaction products of arsenic halides and arsenic hydrides.

In a still further embodiment, the method uses a dopant source composition comprising a composition selected from the group consisting of poly-phosphorus 6- and 7-member ring compounds, cluster halides and caged compounds.

Yet another embodiment of the method employs a dopant source composition comprising a composition selected from the group consisting of poly-arsenic 6- and 7-member ring compounds, cluster halides and caged compounds.

In other embodiments, the dopant source composition comprises a composition selected from the group consisting of $P_2H_4$, $As_2H_4$, $P_2I_4$, $POCl_3$, $PF_3$, $P_2F_4$, $As_2I_4$, $AsOCl_3$, $AsF_3$, and $As_2F_4$.

In still other embodiments, the dopant source composition comprises a composition selected from the group consisting of mixed halides as described earlier herein, e.g., $P_2Cl_2F_2$ and $As_2Cl_2F_2$.

Each of the foregoing compounds is employed as a dopant source composition in corresponding respective specific embodiments of the method of the disclosure.

The dopant source composition can therefore comprise a poly-arsenic compound, or alternatively a poly-phosphorus compound.

The ionization of the dopant source composition can be carried out in any suitable manner, within the skill of the art based on the disclosure herein. In various embodiments, the dopant source composition is ionized under ionizing conditions forming an ion beam. The ion beam may be constituted and arranged so that it is accelerated toward the substrate, e.g., a substrate comprising a silicon wafer or a substrate for a microelectronic device.

In various embodiments, the dopant source composition is isotopically enriched beyond a natural abundance composition.

In still other embodiments, the dopant source composition is flowed to an ion source for the aforementioned ionizing, in a carrier gas, e.g., a gas selected from the group consisting of argon, xenon, and helium.

In various embodiments, the dopant source compositions of the disclosure, or their ionization products, may be restricted by excluding any one or more of the following species:

$As_nH_x^+$, where n=3 or 4 and $0 \leq x \leq n+2$ for an N-type cluster, and either $B_{10}H_x^+$ or $B_{10}H_x^-$ for a P-type cluster;
$As_3H_x^+$ and $As_4H_x^+$;
$P_nH_x^+$, where n is 2, 3, or 4 and $0 \leq x \leq 6$;
$B_nH_x^+$, where n is 2, 3, or 4 and $0 \leq x \leq 6$; and
$A_nH_x^+$ or $AnRHx^+$ where n is $\geq 4$, $x \geq 0$, A=As or P, and R is a molecule not containing phosphorus and which is not injurious to the implantation process.

It will be recognized at the present disclosure contemplates use of a variety of dopant source compounds and feed gas compositions of a cluster source character, for generating phosphorus and arsenic ions of at high concentration.

What is claimed is:

1. An on implantation method, comprising ionizing a dopant source composition to form dopant ions, and implanting the dopant ions in a substrate, wherein the dopant source composition comprises a composition selected from the group consisting of:
   (i) diphosphorus oxyhalides;
   (ii) diarsenic halides and oxyhalides;
   (iii) substituted phosphanes of the formula $P_nH_xR_y$, wherein R is selected from alkyl, alkoxy, O, NR and other functional groups containing H, C, O and N atoms, n is an integer having a value of from 2 to 22, x is an integer having a value of from 2 to 22, and y is an integer having a value of from 1 to 22;
   (iv) substituted arsines of the formula $As_nH_xR_y$, wherein R is selected from alkyl, O, NR and other functional groups containing H, C, O and N atoms, n is an integer having a value of from 2 to 22, x is an integer having a value of from 2 to 22, and y is an integer having a value of from 1 to 22;
   (v) diphosphanes of the formula $R_2P-PR'_2$ wherein $R_2$ and $R'_2$ are each independently selected from $C_{1-6}$ alkyls, aryls, and other functional groups containing H, C, O and N atoms;
   (vi) diarsanes of the formula $R_2As-AsR'_2$ wherein $R_2$ and $R'_2$ are each independently selected from $C_{1-6}$ alkyls, aryls, and other functional groups containing H, C, O and N atoms;
   (vii) phosphorus source compounds with P—P bonds, produced as reaction products of phosphorus halides and phosphorus hydrides; and
   (vii) arsenic source compounds with As—As bonds, produced as reaction products of arsenic halides and arsenic hydrides.

2. The ion implantation method of claim 1, wherein the dopant source composition comprises a composition selected from the group consisting of diphosphorus oxyhalides.

3. The ion implantation method of claim 1, wherein the dopant source composition comprises a composition selected from the group consisting of diarsenic halides and oxyhalides.

4. The ion implantation method of claim 1, wherein the dopant source composition comprises a composition selected from the group consisting of substituted phosphanes of the formula $P_nH_xR_y$, wherein R is selected from alkyl, alkoxy, O, NR and other functional groups containing H, C, O and N atoms, n is an integer having a value of from 2 to 22, x is an integer having a value of from 2 to 22, and y is an integer having a value of from 1 to 22.

5. The ion implantation method of claim 1, wherein the dopant source composition comprises a composition selected from the group consisting of substituted arsines of the formula $As_nH_xR_y$, wherein R is selected from alkyl, O, NR and other functional groups containing H, C, O and N atoms, n is an integer having a value of from 2 to 22, x is an integer having a value of from 2 to 22, and y is an integer having a value of from 1 to 22.

6. The ion implantation method of claim 1, wherein the dopant source composition comprises a composition selected from the group consisting of diphosphanes of the formula $R_2P-PR'_2$ wherein $R_2$ and $R'_2$ are each independently selected from $C_{16}$ alkyls, aryls, and other functional groups containing H, C, O and N atoms.

7. The ion implantation method of claim 1, wherein the dopant source composition comprises a composition selected from the group consisting of diarsanes of the formula $R_2As-AsR'_2$ wherein $R_2$ and $R'_2$ are each independently selected from $C_{16}$ alkyls, aryls, and other functional groups containing H, C, O and N atoms.

8. The ion implantation method of claim 1, wherein the dopant source composition comprises a composition selected from the group consisting of phosphorus source compounds with P—P bonds, produced as reaction products of phosphorus halides and phosphorus hydrides.

9. The ion implantation method of claim 1, wherein the dopant source composition comprises a composition selected from the group consisting of arsenic source compounds with As—As bonds, produces reaction products of arsenic halides and arsenic hydrides.

10. The ion implantation of claim 1, wherein the dopant source composition comprises a composition selected from the group consisting of $As_2I_4$ and $As_2F_4$.

11. The ion implantation method of claim 1, wherein the dopant source composition comprises $As_2Cl_2F_2$.

12. The ion implantation method of claim 1, wherein the dopant source composition is ionized under ionizing conditions forming an ion beam, and the ion beam is accelerated toward the substrate.

13. The ion implantation method of claim 1, wherein the dopant source composition is flowed to an ion source for said ionizing, in a carrier gas comprising a gas selected from the group consisting of argon, xenon, and helium.

14. An ion implantation method, comprising ionizing a dopant source composition to form dopant ions and implanting the dopant ions in a substrate, wherein the dopant source composition comprises a composition selected from the group consisting of:
   (i) phosphorus hydrides of the formula $P_nH_x$ wherein n is an integer having a value of from 2 to 22, x is an integer having a value of from 2 to 11, and x is not 5 when n is 2;
   (ii) arsenic hydrides of the formula $As_nH_y$ wherein n is an integer having a value of from 2 to 5, and y is an integer having a value of from 2 to 10;
   (iii) phosphorus and diphosphorus halides and oxyhalides, excluding $PF_3$;
   (iv) arsenic and diarsenic halides and oxyhalides, excluding $AsF_5$;
   (v) substituted phosphanes of the formula $P_nH_xR_y$, wherein R is selected from alkyl alkoxy, O, NR and other functional groups containing H, C, O and N atoms n is an integer having a value of from 2 to 22 x is an integer having a value of from 2 to 22 and y is an integer having a value of from 1 to 22;
   (vi) substituted arsines of the formula $As_nH_xR_y$, wherein R is selected from alkyl O, NR and other functional groups containing H, C, O and N atoms n is an integer having a value of from 2 to 22, x is an integer having a value of from 2 to 22, and y is an integer having a value of from 1 to 22;

(vii) of the formula $R_2P-PR'_2$ wherein $R_2$ and $R'_2$ are each independently selected from $C_{1-6}$ alkyls, aryls, and other functional groups containing H, C, O and N atoms;

(viii) diarsanes of the formula $R_2As-AsR'_2$ wherein $R_2$ and $R'_2$ are each independently selected from $C_{1-6}$ alkyls, aryls, and other functional groups containing H, C, O and N atoms;

(ix) phosphorus source compounds in combination with reducing agents that can induce in situ formation of product compounds with P—P bonds;

(x) source compounds in combination with reducing agents that can induce in situ formation of product compounds with As—As bonds;

(xi) phosphorus source compounds with P—P bonds produced as reaction products of phosphorus halides and phosphorus hydrides;

(xii) arsenic source compounds with As—As bonds, produces reaction products of arsenic halides and arsenic hydrides;

(xiii) poly-phosphorus 6- and 7-member ring compounds cluster halides and caged compounds; and (xiv) poly-arsenic 6- and 7-member ring compounds, cluster halides and caged compounds wherein said dopant source composition is isotopically enriched beyond a natural abundance composition.

15. An ion implantation method, comprising ionizing a dopant source composition to form dopant ions, and implanting the dopant ions in a substrate, wherein the dopant source composition comprises a composition selected from the group consisting of:

substituted phosphanes of the formula $P_nH_xR_y$, wherein R is selected from alkyl, alkoxy, O, NR and other functional groups containing H, C, O and N atoms, n is an integer having a value of from 2 to 22, x is an integer having a value of from 2 to 22, and y is an integer having a value of from 1 to 22;

substituted arsines of the formula $As_nH_xR_y$, wherein R is selected from alkyl, O, NR and other functional groups containing H, C, O and N atoms, n is an integer having a value of from 2 to 22, x is an integer having a value of from 2 to 22, and y is an integer having a value of from 1 to 22;

diphosphanes of the formula $R_2P-PR'_2$ wherein $R_2$ and $R'_2$ are each independently selected from $C_{1-6}$ alkyls, aryls, and other functional groups containing H, C, O and N atoms;

diarsanes of the formula $R_2As-AsR'_2$ wherein $R_2$ and $R'_2$ are each independently selected from $C_{1-6}$ alkyls, aryls, and other functional groups containing H, C, O and N atoms;

phosphorus source compounds with P—P bonds, produced as reaction products of phosphorus halides and phosphorus hydrides; and arsenic source compounds with As—As bonds, produced as reaction products of arsenic halides and arsenic hydrides.

* * * * *

UNITED STATES PATENT AND TRADEMARK OFFICE
CERTIFICATE OF CORRECTION

| | | |
|---|---|---|
| PATENT NO. | : 9,269,582 B2 | Page 1 of 1 |
| APPLICATION NO. | : 14/006662 | |
| DATED | : February 23, 2016 | |
| INVENTOR(S) | : Oleg Byl | |

It is certified that error appears in the above-identified patent and that said Letters Patent is hereby corrected as shown below:

In the Specification

Column 4, line 15: "$P_2P_4$" should be -- $P_2F_4$ --.

In the Claims

Column 9, line 15: "on" should be -- ion --.

Column 9, line 42-43: "produced as" should be -- produces --.

Column 10, line 27: "implantation of" should be -- implantation method of --.

Column 11, line 1: "of the formula" should be -- diphosphanes of the formula --.

Column 11, line 11: "source compounds" should be -- arsenic source compounds --.

Column 12, line 24-25: "produced as" should be -- produces --.

Signed and Sealed this
Twenty-sixth Day of July, 2016

Michelle K. Lee
*Director of the United States Patent and Trademark Office*